United States Patent [19]
Takahashi

[11] Patent Number: 5,909,047
[45] Date of Patent: Jun. 1, 1999

[54] SEMICONDUCTOR MEMORY DEVICE

[75] Inventor: Toshifumi Takahashi, Tokyo, Japan

[73] Assignee: NEC Corporation, Tokyo, Japan

[21] Appl. No.: 08/866,269

[22] Filed: May 30, 1997

[30]     Foreign Application Priority Data

May 31, 1996  [JP]   Japan ..................................... 8-138584

[51] Int. Cl.$^6$ ............................. H01L 29/76; H01L 29/94
[52] U.S. Cl. ........................... 257/369; 257/351; 257/903
[58] Field of Search ................................... 257/350, 351, 257/369, 903, 904

[56]            References Cited

FOREIGN PATENT DOCUMENTS 6-169071   6/1994   Japan .

OTHER PUBLICATIONS

*IDEM Technical Digest*, 1991, pp. 481–484, "16 Mbit SRAM Cell Technologies for 2.0 v. Operation".

*Primary Examiner*—Valencia Martin-Wallace
*Attorney, Agent, or Firm*—Sughrue, Mion, Zinn, Macpeak & Seas, PLLC

[57]            ABSTRACT

A semiconductor memory device capable of high-speed operation, low-voltage operation, and low power-consumption. First and second driver transistors are laid out in such a way that the channel regions of first and second driver transistors extend in a direction oblique to first and second word lines. First and second transfer transistors are laid out in such a way that the channel regions of the first and second transfer transistors extend in a direction perpendicular to the first and second word lines. The channel regions of the first and second transfer transistors and the contact resistance of the first and second bit contacts are substantially constant independent of an allowable overlay error, respectively, thereby keeping the capability of the first and second transfer transistors and the bit contact resistance the same independent of the allowable overlay error.

9 Claims, 14 Drawing Sheets

FIG. 13
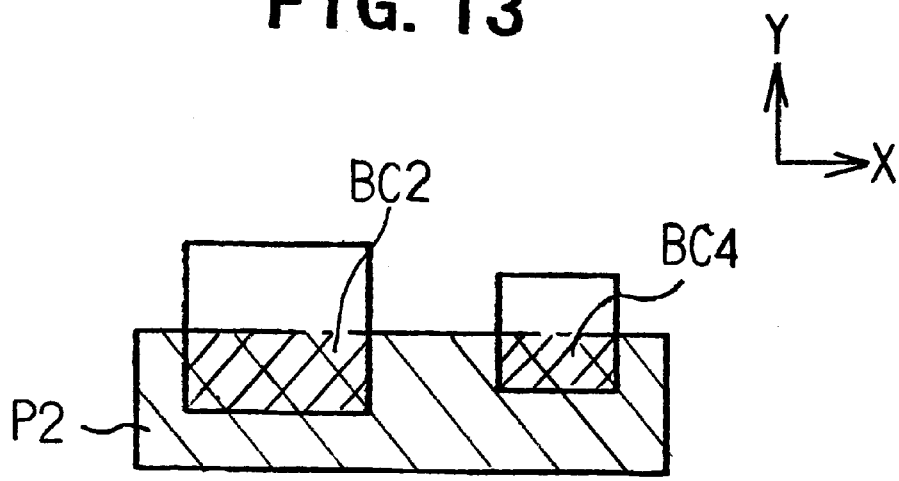
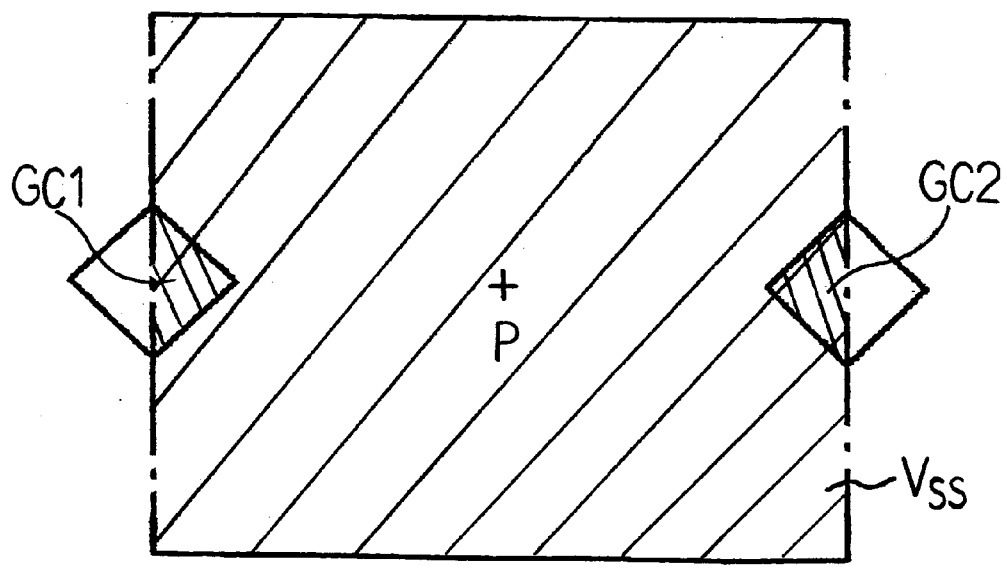
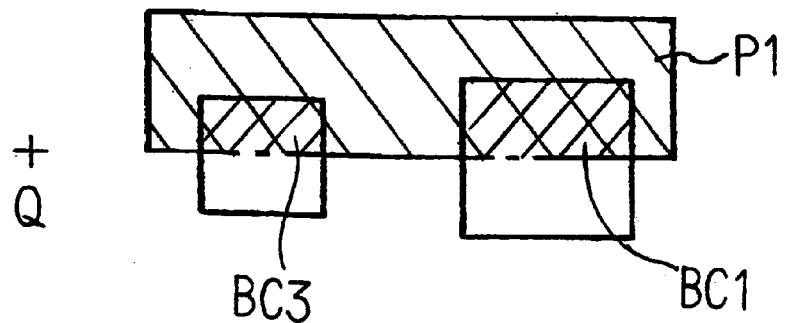

SEMICONDUCTOR MEMORY DEVICE

BACKGROUND OF THE INVENTION

1. Field of the Invention

The present invention relates to a semiconductor memory device and more particularly, to a static Random-Access Memory device (SRAM) each memory cell of which has a function of a flip-flop including driver and transfer transistors formed by Metal-Oxide-Semiconductor Field-Effect Transistors (MOSFETS) and load elements formed by resistors or thin-film transistors (TFTS).

2. Description of the Prior Art

FIG. 1 shows a memory cell structure of a conventional SRAM of this sort, which is of the split word-line type.

As shown in FIG. 1, the layout of elements and their interconnections in the memory cell is symmetric with respect to a central point P of the cell, thereby improving the stability of the memory operation.

Two word lines WL101 and WL102 are arranged to extend along the X-ax is, which are laid out to be symmetric with respect to the central point P. Two bit lines (not shown) are arranged to extend along the Y-axis perpendicular to the X-axis, which are laid out to be symmetric with respect to the central point P.

Two active regions D101 and D102 are formed in a semiconductor substrate (not shown). The active regions D101 and D102 are laid out between the word lines WL101 and WL102 to be symmetric with respect to the central point P.

Two patterned conductive layers 101 and 102 are formed between the word lines WL101 and WL102 to extend along the Y-axis. The conductive layers 101 and 102 are laid out to be symmetric with respect to the central point P. The conductive layer 101 is overlapped with the active regions D101 and D102. The conductive layer 102 also is overlapped with the active regions D101 and D102.

The overlapped part 101a of the conductive layer 101 with the active region D101 serves as a gate electrode of a first driver MOSFET Td101. Parts D101a and D101b of the active region D101, which are located at each side of the part 101a, serve as a pair of source/drain regions of the first driver MOSFET Td101, respectively.

The overlapped part 102a of the conductive layer 102 with the active region D102 serves as a gate electrode of a second driver MOSFET Td102. Parts D102a and D102b of the active region D102, which are located at each side of the part 101a, serve as a pair of source/drain regions of the second driver MOSFET Td102, respectively.

The overlapped part WL101a of the word line WL101 with the active region D101 serves as a gate electrode of a first transfer MOSFET Ta101. The part D101b and a part D101c of the active region D101, which are located at each side of the part WL101a, serve as a pair of source/drain regions of the first transfer MOSFET Ta101, respectively.

The overlapped part WL102a of the word line WL102 with the active region D102 serves as a gate electrode of a second transfer MOSFET Ta102. The part D102b and a part D102c of the active region D102, which are located at each side of the part WL102a, serve as a pair of source/drain regions of the second transfer MOSFET Ta102, respectively.

A bit contact BC101 is laid out to be overlapped with the part D101c of the active region D101. A bit contact BC102 is laid out to be overlapped with the part D102c of the active region D102.

A ground contact GC101 is laid out to be overlapped with the part D101a of the active region D101. A ground contact GC102 is laid out to be overlapped with the part D102a of the active region D102.

Thus, the channels of the transfer MOSFETs Ta101 and Ta102 are formed under the overlapped part WL101a of the word line WL101 and the overlapped part WL102a of the word line WL102, respectively, both of which run along the Y-axis. On the other hand, the channels of the driver MOSFETs Td101 and Td102 are formed under the overlapped part 101a of the conductive layer 101 and the overlapped part 102a of the conductive layer 102, respectively, both of which run along the X-axis.

Accordingly, the channels of the transfer MOSFETs Ta101 and Ta102 are perpendicular to those of the driver MOSFETs Td101 and Td102.

FIG. 2 shows a memory cell structure of another conventional SRAM of this sort. This SRAM is of the split word-line type, and disclosed in the Japanese Non-Examined Patent Publication No. 6-169071 published in June 1994.

As shown in FIG. 2, similar to the conventional SRAM of FIG. 1, the layout of elements and their interconnections in the memory cell is symmetric with respect to a central point P of the cell, thereby increasing the channel length of the transfer MOSFETs.

Two word lines WL201 and WL202 are arranged to extend along the X-axis, which are laid out to be symmetric with respect to the central point P. The word lines WL201 and WL202 are bent outwardly.

Two bit lines (not shown) are arranged to extend along the Y-axis perpendicular to the X-axis, which are laid out to be symmetric with respect to the central point P.

Two active regions D201 and D202 are formed in a semiconductor substrate (not shown) to extend almost a straight line oblique to the Y-direction. The active regions D201 and D202 are laid out between the word lines WL201 and WL202 to be symmetric with respect to the central point P.

Two patterned conductive layers 201 and 202 are formed between the word lines WL201 and WL202 to extend along a straight line oblique to the Y-direction. The conductive layers 201 and 202 are laid out to be symmetric with respect to the central point P. The straight line along which the conductive layers 201 and 202 extends is inclined toward an opposite side to that of the active regions D201 and D202.

The conductive layer 201 is overlapped with the active regions D201 and D202. The conductive layer 202 also is overlapped with the active regions D201 and D202.

The overlapped part 201a of the conductive layer 201 with the active region D201 serves as a gate electrode of a first driver MOSFET Td201. Parts D201a and D201b of the active region D201, which are located at each side of the overlapped part 201a, serve as a pair of source/drain regions of the first driver MOSFET Td201, respectively.

The overlapped part 202a of the conductive layer 202 with the active region D202 serves as a gate electrode of a second driver MOSFET Td202. Parts D102a and D102b of the active region D202, which are located at each side of the overlapped part 201a, serve as a pair of source/drain regions of the second driver MOSFET Td202, respectively.

The overlapped part WL201a of the word line WL201 with the active region D201 serves as a gate electrode of a first transfer MOSFET Ta201. Parts D201c and D201d of the active region D201, which are located at each side of the overlapped part WL201a, serve as a pair of source/drain regions of the first transfer MOSFET Ta201, respectively.

The overlapped part WL202a of the word line WL202 with the active region D202 serves as a gate electrode of a second transfer MOSFET Ta202. Parts D202c and D202d of the active region D202, which are located at each side of the overlapped part WL202a, serve as a pair of source/drain regions of the second transfer MOSFET Ta202, respectively.

The overlapped parts WL201a and WL202a are located at their inclined parts, respectively.

A bit contact BC201 is laid out to be overlapped with the part D201d of the active region D201. A bit contact BC202 is laid out to be overlapped with the part D202d of the active region D202.

Thus, the channels of the transfer MOSFETs Ta201 and Ta202 are formed under the overlapped part WL201a of the word line WL201 and the overlapped part WL202a of the word line WL202, respectively, both of which run along the straight line oblique to the Y-axis. Similarly, the channels of the driver MOSFETs Td201 and Td202 are formed under the overlapped part 201a of the conductive layer 201 and the overlapped part 202a of the conductive layer 202, respectively, both of which run along the straight line oblique to the Y-axis.

Accordingly, the channels of the transfer MOSFETs Ta201 and Ta202 run in approximately the same direction as those of the driver MOSFETs Td201 and Td202.

However, in the memory cell of the conventional SRAM shown in FIG. 1, there is a problem that the parasitic capacitance between the bit lines and the wiring resistance are high and as a result, the high-speed operation of the SRAM is difficult to be realized. This problem is caused by the fact that the short side of the memory cell becomes shorter and the long side thereof becomes longer (in other words, the aspect ration of the memory cell becomes large), thereby decreasing the pitch of the bit lines and increasing the wiring or interconnection length.

In the memory cell of the conventional SRAM shown in FIG. 2, the above problem of the decreased pitch of the bit lines and the increased wiring/interconnection length is solved to some extent. However, there is a problem that the performance of the memory cell tends to fluctuate, which is caused by the following reason. As described previously, the overlapped parts WL201a and WL202a of the word lines WL201a and WL202a are located at their inclined parts, respectively. Therefore, if some overlay or placement error of the word lines WL201 and WL202 occurs with respect to the corresponding active regions D201 and D202 during a lithography process, the performance of the transfer MOSFETs Ta201 and 202 will fluctuate to a large extent.

Also, the parts D201d and D202d of the active regions D201 and D202 are located outside the corresponding word lines WL201 and WL202, and are angled at a specific value, respectively. The bit contacts BC201 and BC202 are laid out to be overlapped with the parts D201d and D202d, respectively. As a result, if some overlay or placement error of the bit contacts BC201 and BC202 occurs with respect to the corresponding active regions D201 and D202 during a lithography process, the contact resistance of the bit contacts BC201 and BC202 tends to be unbalanced over an allowable extent.

SUMMARY OF THE INVENTION

Accordingly, an object of the present invention to provide a semiconductor memory device capable of high-speed operation.

Another object of the present invention is to provide a semiconductor memory device that is able to prevent the performance fluctuation of the memory cells.

Still another object of the present invention is to provide a semiconductor memory device that is capable of low-voltage operation and low power-consumption.

The above objects together with others not specifically mentioned will become clear to those skilled in the art from the following description.

In a semiconductor memory device according to the present invention, each memory cell has the following structure.

A first active region is formed in a surface area of a semiconductor substrate. A second active region is formed in the surface area of the substrate to be apart from the first active region.

A first word line is formed in a first level to extend in a first direction. The first word line is overlapped with the first active region, thereby forming a first overlapped area of the first active region and an overlapped area of the first word line.

A channel region of a first transfer transistor is formed in the first overlapped area of the first active region to extend in a second direction perpendicular to the first direction. A pair of source/drain regions of tie first transfer transistor are formed in the first active region at each side of the first overlapped area of the first active region. The overlapped area of the first word line serves as a gate electrode of the first transfer transistor.

A second word line is formed in the first level to extend in the first direction. The second word line is overlapped with the second active region, thereby forming a first overlapped area of the second active region and an overlapped area of the second word line.

A channel region of a second transfer transistor is formed in the first overlapped area of the second active region to extend in the second direction. A pair of source/drain regions of the second transfer transistor are formed in the second active region at each side of the first overlapped area of the second active region. The overlapped area of the second word line serves as a gate electrode of the second transfer transistor.

A first patterned conductive layer is formed in the first level to be overlapped with the first active region, thereby forming a second overlapped area of the first active region and an overlapped area of the first conductive layer.

A channel region of a first driver transistor is formed in the second overlapped area of the first active region to extend in a third direction oblique to the first direction. A pair of source/drain regions of the first driver transistor are formed in the first active region at each side of the second overlapped area of the first active region. The overlapped area of the first conductive layer serves as a gate electrode of the first driver transistor A second patterned conductive layer is formed in the first level to be overlapped with the second active region, thereby forming a second overlapped area of the second active region and an overlapped area of the second conductive layer.

A channel region of a second driver transistor is formed in the second overlapped area of the second active region to extend in the third direction. A pair of source/drain regions of the second driver transistor are formed in the second active region at each side of the second overlapped area of the second active region. The overlapped area of the second conductive layer serves as a gate electrode of the second driver transistor.

A first bit line is formed in a second level to extend in the second direction. A second bit line is formed in the second level to extend in the third direction.

With the semiconductor memory device according to the present invention, the first and second driver transistors are laid out in such a way that the channel regions of the first and second driver transistors extend in the third direction oblique to the first and second word lines. Also, the first and second transfer transistors are laid out in such a way that the channel regions of the first and second transfer transistors extend in the second direction perpendicular to the first and second word lines. Therefore, the aspect ratio of the memory cell can be decreased. This means that the long side of the memory cell has a length longer than that of the short side thereof by a small difference.

Accordingly, the pitch of the first and second bit lines can be increased and at the same time, the wiring/interconnection length can be decreased. As a result, the semiconductor memory device according to the present invention is capable of high-speed operation.

In a preferred embodiment of the device according to the present invention, a first bit contact is laid out to be overlapped with one of the pair of source/drain regions of the first transfer transistor. The overlapped one of the pair of source/drain regions of the first transfer transistor with the first bit contact extends in the second direction.

A second bit contact is laid out to be overlapped with one of the pair of source/drain regions of the second transfer transistor. The overlapped one of the pair of source/drain regions of the second transfer transistor with the second bit contact extends in the second direction.

The first overlapped area of the first active region is designed to have a substantially constant size independent of an allowable overlay error between the first active region and the first word line.

The first overlapped area of the second active region is designed to have a substantially constant size independent of an allowable overlay error between the second active region and the second word line.

In this case, the first word line extends in the first direction, and the channel region of the first transfer transistor extends in the second direction perpendicular to the first direction. Also, the first overlapped area of the first active region (i.e., the channel region of the first transfer transistor) is designed to have a substantially constant size independent of an allowable overlay error between the first active region and the first word line.

Similarly, the second word line extends in the first direction, and the channel region of the second transfer transistor extends in the second direction perpendicular to the first direction. Also, the first overlapped area of the second active region (i.e., the channel region of the second transfer transistor) is designed to have a substantially constant size independent of an allowable overlay error between the second active region and the second word line.

Accordingly, the capability of the first and second transfer transistors is kept to be the same independent of the allowable overlay error.

Further, the first bit contact is laid out to be overlapped with one of the pair of source/drain regions of the first transfer transistor, and the overlapped one of the pair of source/drain regions of the first transfer transistor with the first bit contact extends in the second direction. Similarly, the second bit contact is laid out to be overlapped with one of the pair of source/drain regions of the second transfer transistor, and the overlapped one of the pair of source/drain regions of the second transfer transistor with the second bit contact extend in the second direction.

Accordingly, the contact resistance of the first and second bit contacts is kept to be the same independent of the allowable overlay error.

Thus, the capability of the first and second transfer transistors and the contact resistance of the first and second bit contacts are kept the same independent of the allowable overlay error. As a result, the performance fluctuation of the memory cells can be prevented, which enables the low-voltage operation and low power-consumption of the semiconductor memory device.

BRIEF DESCRIPTION OF THE DRAWINGS

In order that the invention may be readily carried into effect, it will now be described with reference to the accompanying drawings.

FIG. 13 shows a layout of the memory cell of a semiconductor memory device according to a sixth embodiment of the invention, in which the ground line, the ground contacts, the bit contacts, and the bit contact pads are illustrated.

DETAILED DESCRIPTION OF THE PREFERRED EMBODIMENTS

Figure 1:
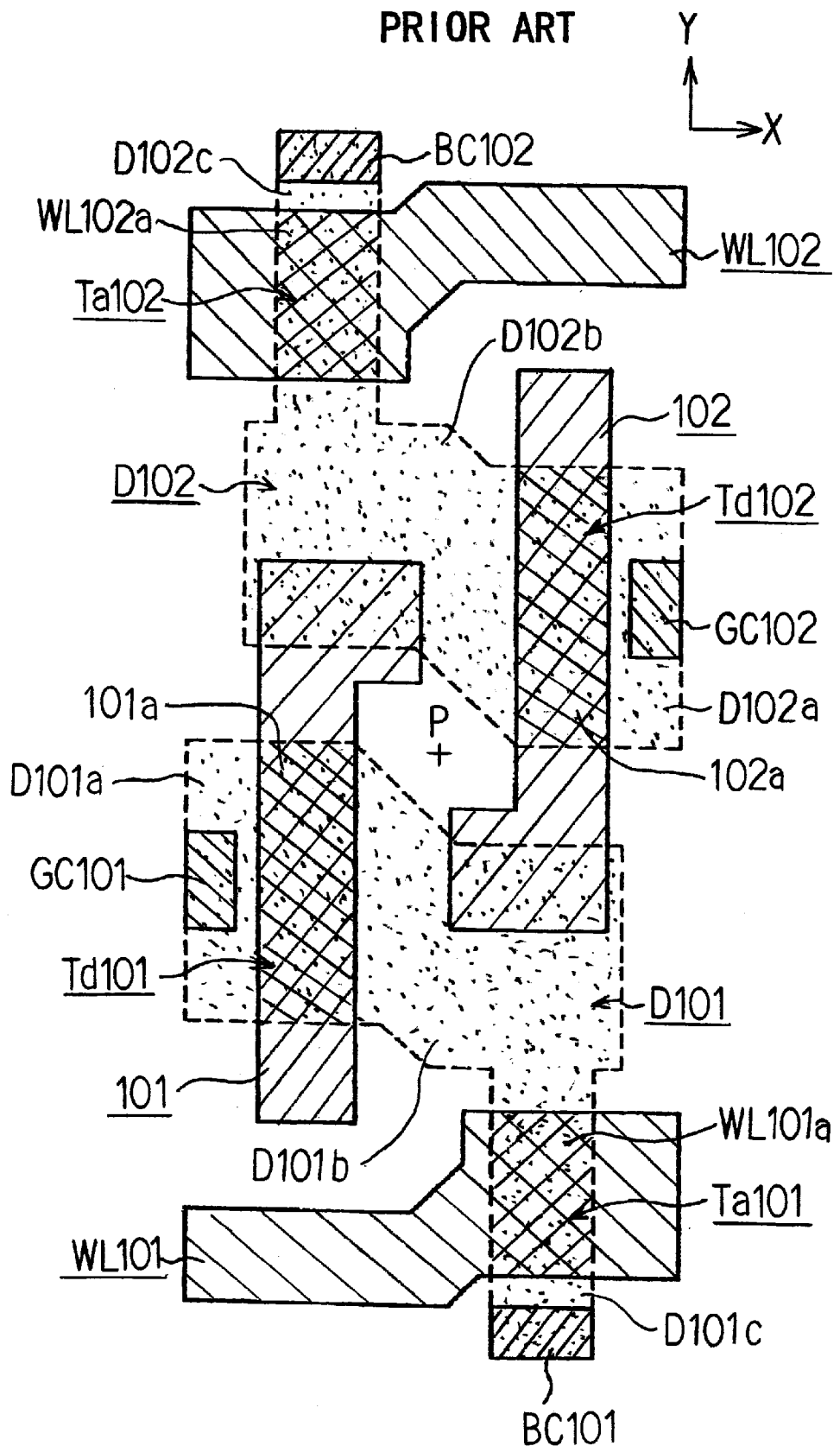
FIG. 1 schematically shows a layout of the memory cell of a conventional semiconductor memory device.
Figure 2:
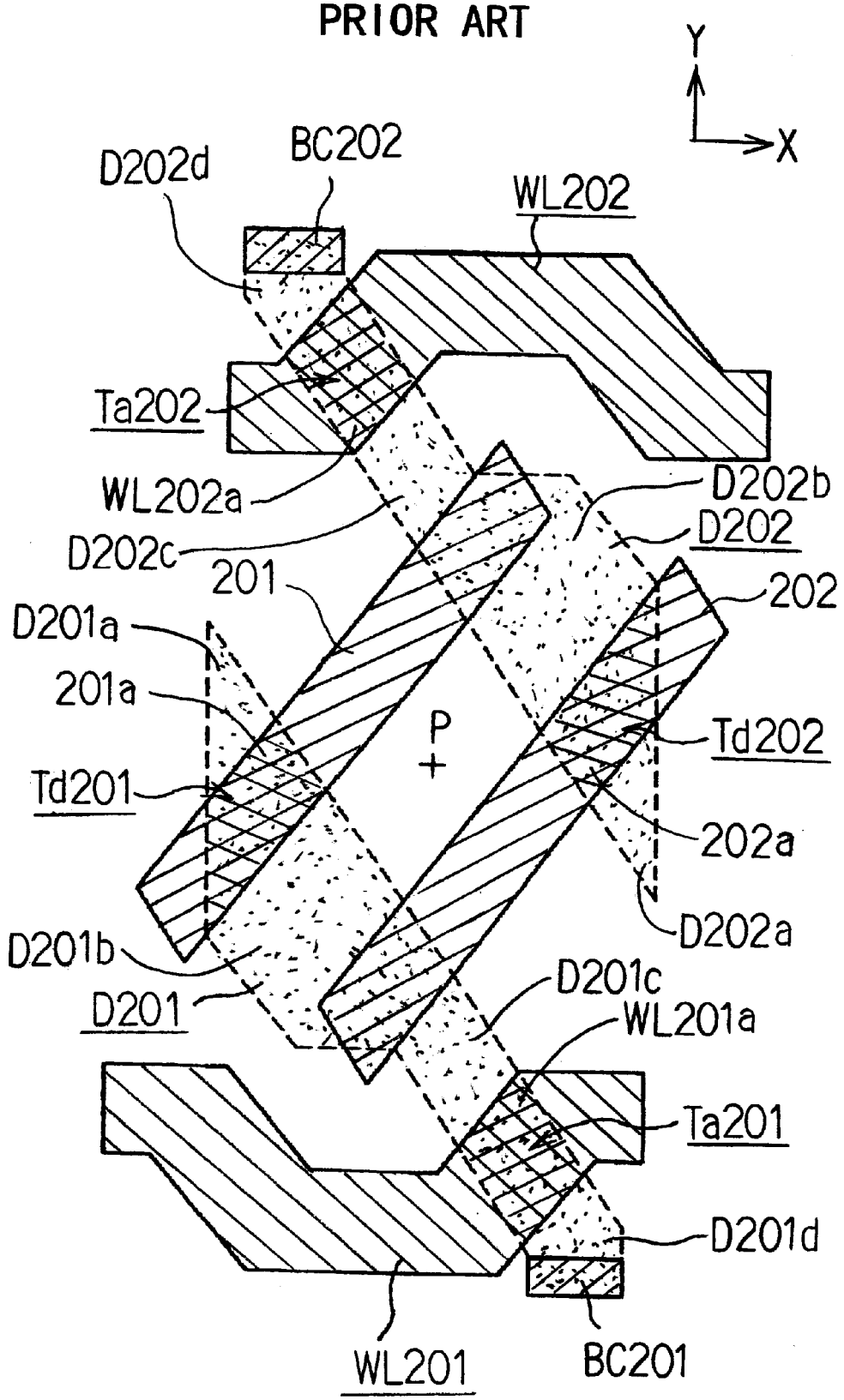
FIG. 2 schematically shows a layout of the memory cell of another conventional semiconductor memory device.

Preferred embodiments of the present invention will be described below referring to the drawings attached.

FIRST EMBODIMENT

A semiconductor memory device according to a first embodiment is shown in FIGS. 3 to 7, which is constituted as an SRAM. This SRAM includes a plurality of memory cells 9 regularly arranged on a semiconductor substrate (not shown here).

Figure 3:
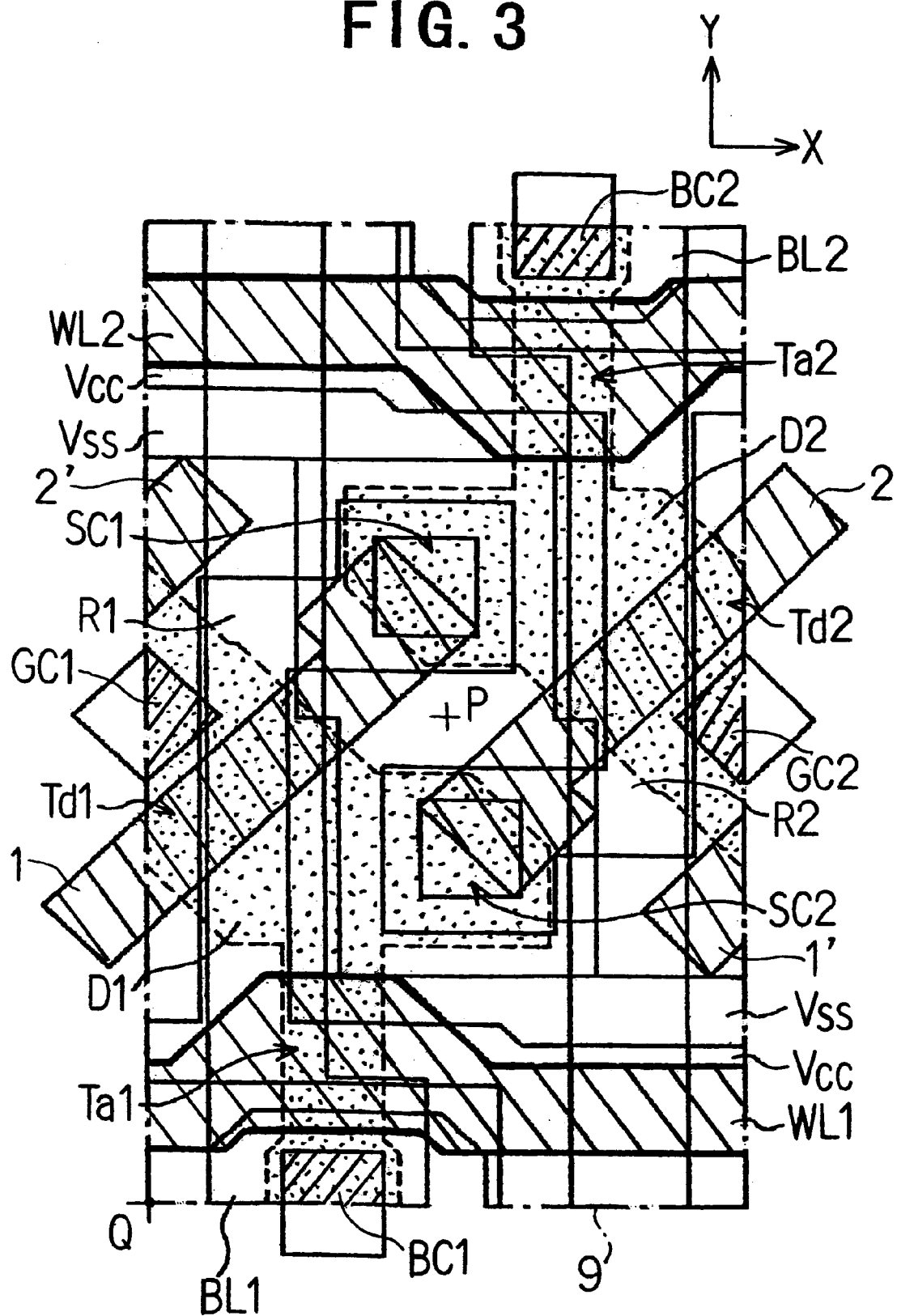
FIG. 3 shows a layout of the memory cell of a semiconductor memory device according to a first embodiment of the present invention.

In FIG. 3, the reference character P denotes a central point P of the cell 9, and the reference character Q denotes a corner of the cell 9. The elements and their interconnections in the memory cell 9 has a layout symmetric with respect to the central point P.

Figure 4:
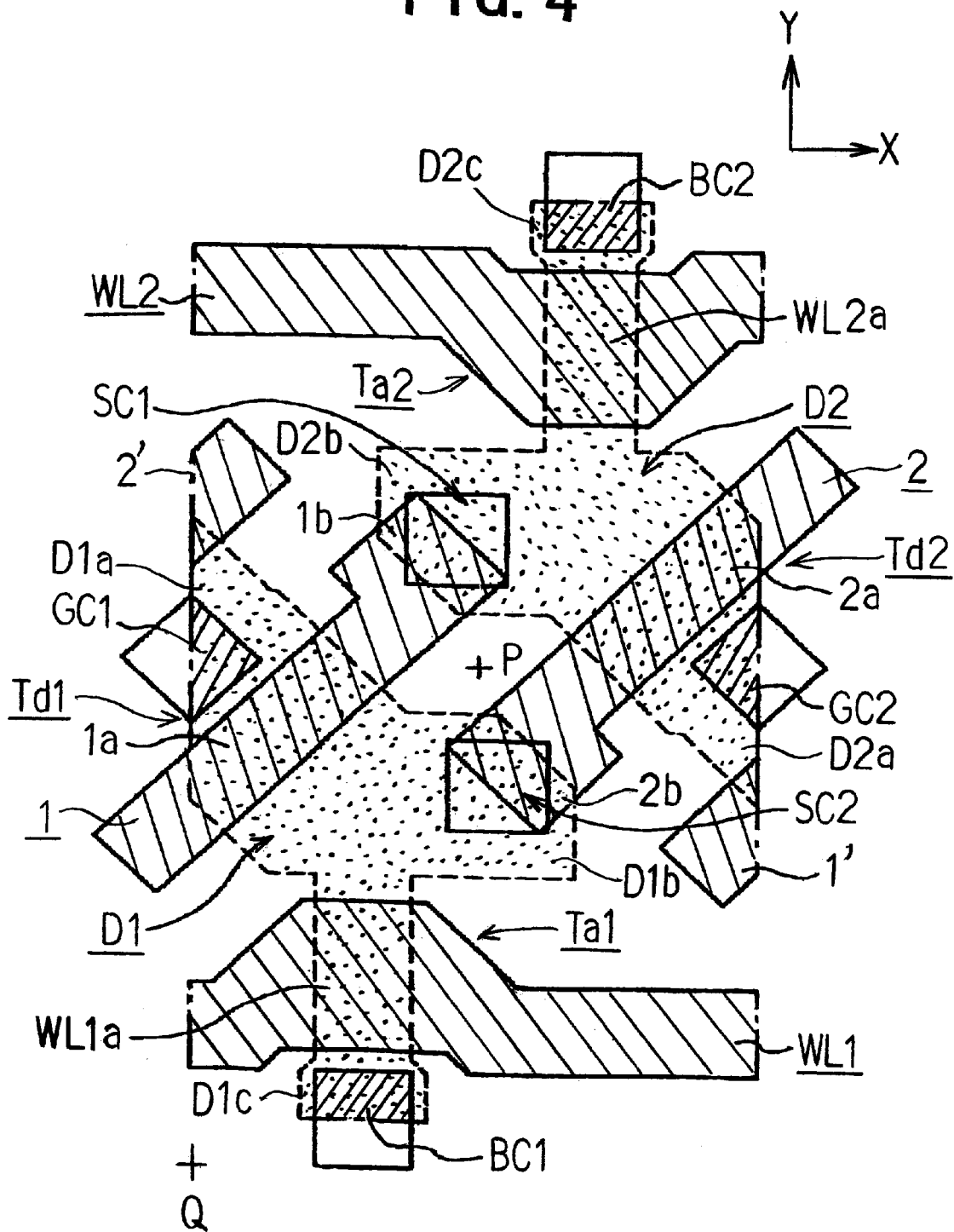
FIG. 4 shows a layout of the memory cell of the semiconductor memory device according to the first embodiment, in which the word lines, the active regions, the patterned conductive layers, the bit contacts, the ground contacts, and the shared contacts are illustrated.

As seen from FIG. 4, two word lines WL1 and WL2 are formed to extend along the X-axis, which are laid out to be symmetric with respect to the central point P. Two bit lines BL1 and BL2 are formed to extend along the Y-axis perpendicular to the X-axis, which are laid out to be symmetric with respect to the central point P.

Two active regions D1 and D2 are formed to be apart from each other in the surface area of the substrate. The active regions D1 and D2 are laid out between the word lines WL1 and WL2 to be symmetric with respect to the central point P.

Two patterned conductive layers 1 and 2 are formed between the word lines WL1 and WL2 to extend along a direction oblique to the X-axis by 45°. The conductive layers 1 and 2 are laid out to be symmetric with respect to the central point P. Each of the conductive layers 1 and 2 has an elongated plan shape running obliquely to the X-axis.

The conductive layer 1 is overlapped with the active regions D1 and D2 at areas 1a and 1b of the layer 1, respectively. The conductive layer 2a is overlapped with the active regions D1 and D2 at areas 2a and 2b of the layer 2, respectively.

A channel region of a first driver MOSFET Td1 is formed in the overlapped area of the active region D1 to extend in the 45°-oblique direction to the X-axis. The overlapped part 1a of the conductive layer 1 with the active region D1 serves as a gate electrode of the first driver MOSFET Td1. Parts D1a and D1b of the active region D1, which are located at each side of the overlapped area 1a of the conductive layer 1, serve as a pair of source/drain regions of the first driver MOSFET Td1, respectively.

A channel region of a second driver MOSFET Td2 is formed in the overlapped area of the active region D2 to extend in the 45°-oblique direction to the X-axis. The overlapped area 2a of the conductive layer 2 with the active region D2 serves as a gate electrode of the second driver MOSFET Td2. Parts D2a and D2b of the active region D2, which are located at each side of the overlapped area 2a of the conductive layer 2, serve as a pair of source/drain regions of the second driver MOSFET Td2, respectively.

The word line WL1 is overlapped with the active region D1 at an area WL1a. A channel region of a first transfer MOSFET Ta1 is formed in the overlapped area of the active region D1 to extend along the Y-axis. The overlapped part WL1a of the word line WL1 with the active region D1 serves as a gate electrode of the first transfer MOSFET Ta1. The part D1b and a part D1c of the active region D1, which are located at each side of the overlapped area WL1a of the word line WL1, serve as a pair of source/drain regions of the first transfer MOSFET Ta1, respectively.

The word line WL2 is overlapped with the active region D2 at an area WL2a. A channel region of a second transfer MOSFET Ta2 is formed in the overlapped area of the active region D2 to extend along the Y-axis. The overlapped area WL2a of the word line WL2 with the active region D2 serves as a gate electrode of the second transfer MOSFET Ta2. The part D2b and a part D2c of the active region D2, which are located at each side of the overlapped area WL2a of the word line WL2, serve as a pair of source/drain regions of the second transfer MOSFET Ta2, respectively.

A ground contact GC1 is laid out to be overlapped with the part D1a of the active region D1 at the left-hand side edge of the cell 9 in FIG. 4. The ground contact GC1 is commonly used by this cell 9 and an adjacent cell (not shown).

A ground contact GC2 is laid out to be overlapped with the part D2a of the active region D2 at the right-hand side edge of the cell 9 in FIG. 4. The ground contact GC2 is commonly used by this cell 9 and an adjacent cell (not shown)

A shared contact SC1 is laid out to be overlapped with the part D2b of the active region D2 and the conductive layer 1, electrically interconnecting the gate electrode of the first driver transistor Td1 with the source/drain regions of the second driver MOSFET Td2 and the second transfer MOSFET Ta2.

A shared contact SC2 is laid out to be overlapped with the part D1b of the active region D1 and the conductive layer 2, electrically interconnecting the gate electrode of the second driver transistor Td2 with the source/drain regions of the first driver MOSFET Td1 and the first transfer MOSFET Ta1.

A bit contact BC1 is laid out to be overlapped with the part D1c of the active region D1. The bit contact BC1 is located at an opposite side to the active region D1 with respect to the word line WL1. In other words, The bit contact BC1 is located outside the word line WL1. The bit contact BC1 is commonly used by this cell 9 and an adjacent cell (not shown).

A bit contact BC2 is laid out to be overlapped with the part D2c of the active region D2. The bit contact B2 is located at an opposite side to the active region D2 with respect to the word line WL2. In other words, The bit contact BC2 is located outside the word line WL2. The bit contact BC2 is commonly used by this cell 9 and an adjacent cell (not shown).

The reference characters 1' and 2' denote patterned conductive layers for adjacent memory cells, respectively.

Thus, the channel regions of the first and second transfer MOSFETs Ta1 and Ta2 are formed under the overlapped part WL1a of the word line WL1 and the overlapped part WL2a of the word line WL2, respectively, and they run along the Y-axis. On the other hand, the channel regions of the first and second driver MOSFETs Td1 and Td2 are formed under the overlapped part 1a of the conductive layer 1 and the overlapped part 2a of the conductive layer 2, respectively, and they run in the direction oblique to the X-axis by 45°.

Accordingly, the channel regions of the first and second transfer MOSFETs Ta1 and Ta2 are angled by 45° with respect to those of the first and second driver MOSFETs Td1 and Td2.

The active regions D1 and D2 are located in the surface area of the substrate. The word lines WL1 and WL2 and the patterned conductive layers 1 and 2 are located in a first level. The first level is arranged over the surface area of the substrate, and is electrically insulated from the substrate by an intervening insulating layer (not shown).

Figure 5:
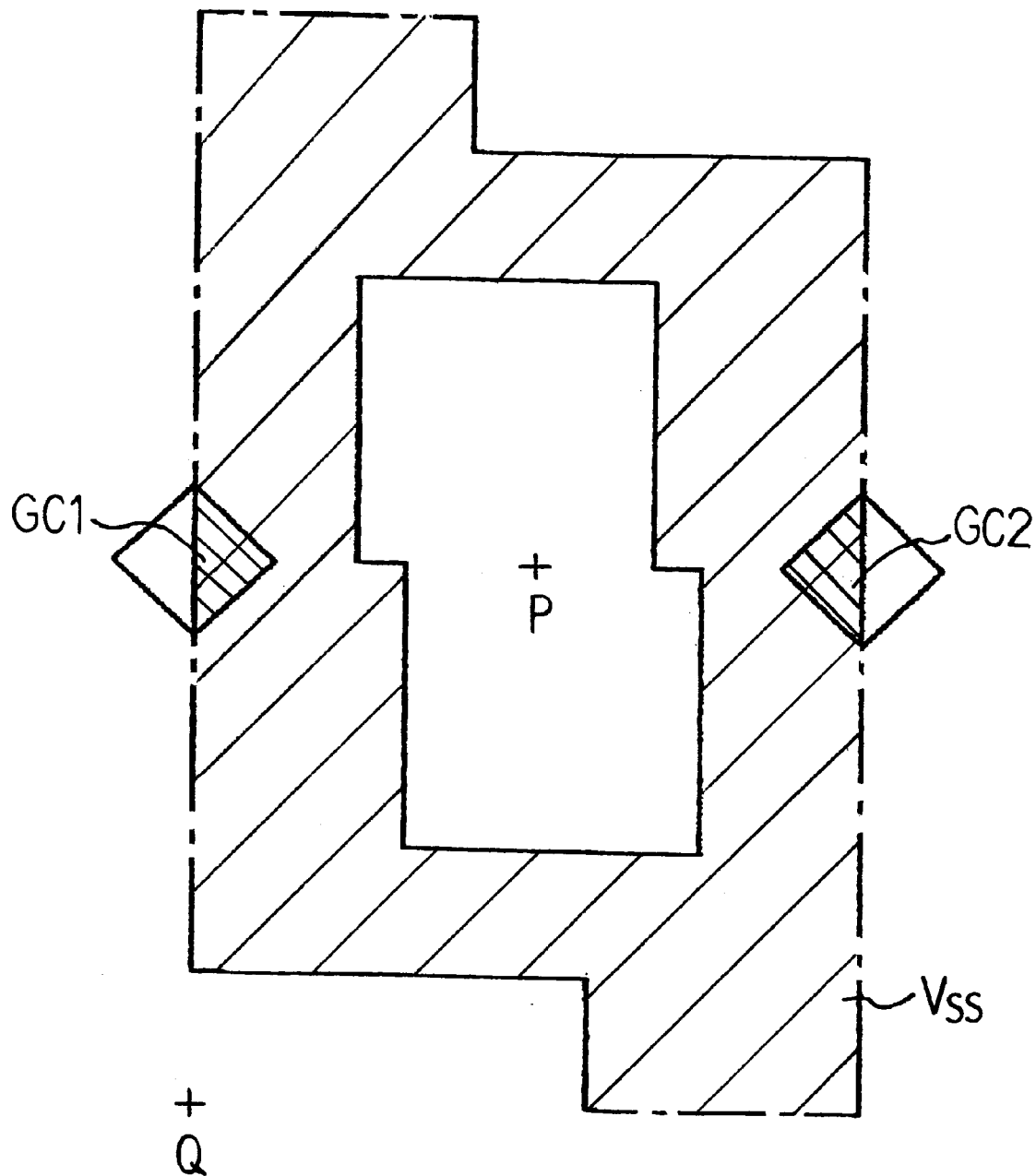
FIG. 5 shows a layout of the memory cell of the semiconductor memory device according to the first embodiment, in which the ground line and the ground contacts are illustrated.

FIG. 5 shows the layout of a ground line $V_{ss}$, which is located in a second level. The second level is arranged over the first level, and is electrically insulated from the first level by an intervening insulating layer (not shown).

The ground line $V_{ss}$ has a pattern that is not overlapped with the shared contacts SC1 and SC2 nor the bit contacts BC1 and BC2. In other words, the pattern of the ground line $V_{ss}$ is designed in such a way that the edges of the ground line $V_{ss}$ have sufficient, lateral distances from the shared contacts SC1 and SC2 and the bit contacts BC1 and BC2.

The ground contacts GC1 and GC2 are overlapped with the ground line $V_{ss}$ at its corresponding edges.

Figure 6:
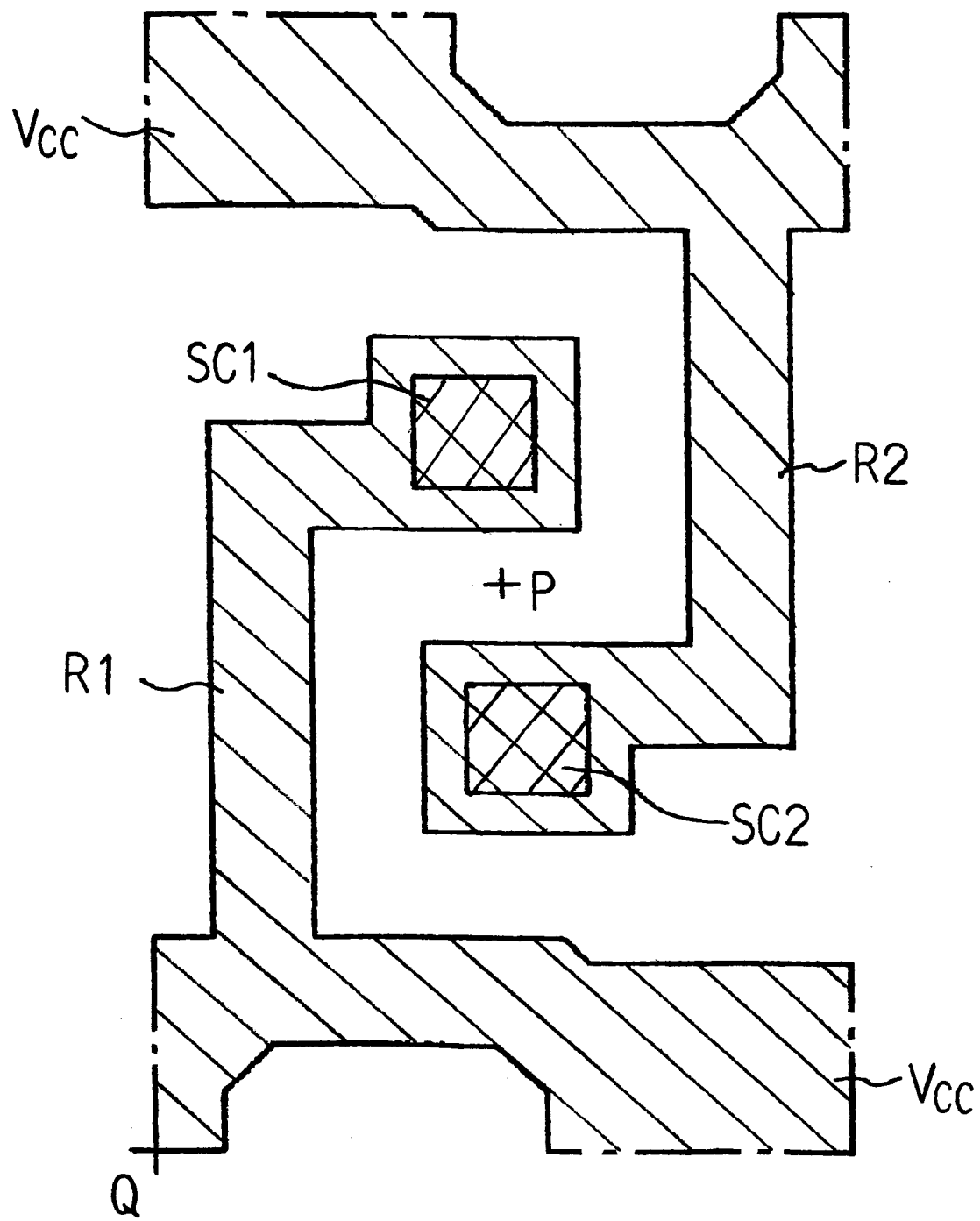
FIG. 6 shows a layout of the memory cell of the semiconductor memory device according to the first embodiment, in which the power supply line, the shared contacts, and the resistors are illustrated.

FIG. 6 shows the layout of power supply lines $V_{cc}$ and load resistors R1 and R2, which are located in a third level. The third level is arranged over the second level, and is electrically insulated from the second level by an intervening insulating layer (not shown).

The power supply lines $V_{cc}$ have patterns that are overlapped with the shared contacts SC1 and SC2 and that are not overlapped with the bit contacts BC1 BC2 nor the ground contacts GC1 and GC2, respectively. The patterns of the power supply lines $V_{cc}$ are designed in such a way that the edges of the power supply lines $V_{cc}$ have sufficient, lateral distances from the ground contacts GC1 and GC2 and the bit contacts BC1 and BC2.

The load resistors R1 and R2 are formed to interconnect the shared contacts SC1 and SC2 with the corresponding edges of the power supply lines vcc, respectively. The load resistors R1 and R2 extend along the Y-axis.

The resistance of the load resistors R1 and P2 is adjusted by changing the dopant concentration of a conductive layer constituting the load resistors R1 and R2.

It is needless to say that TFTs may be used in place of the load resistors R1 and R2.

Figure 7:
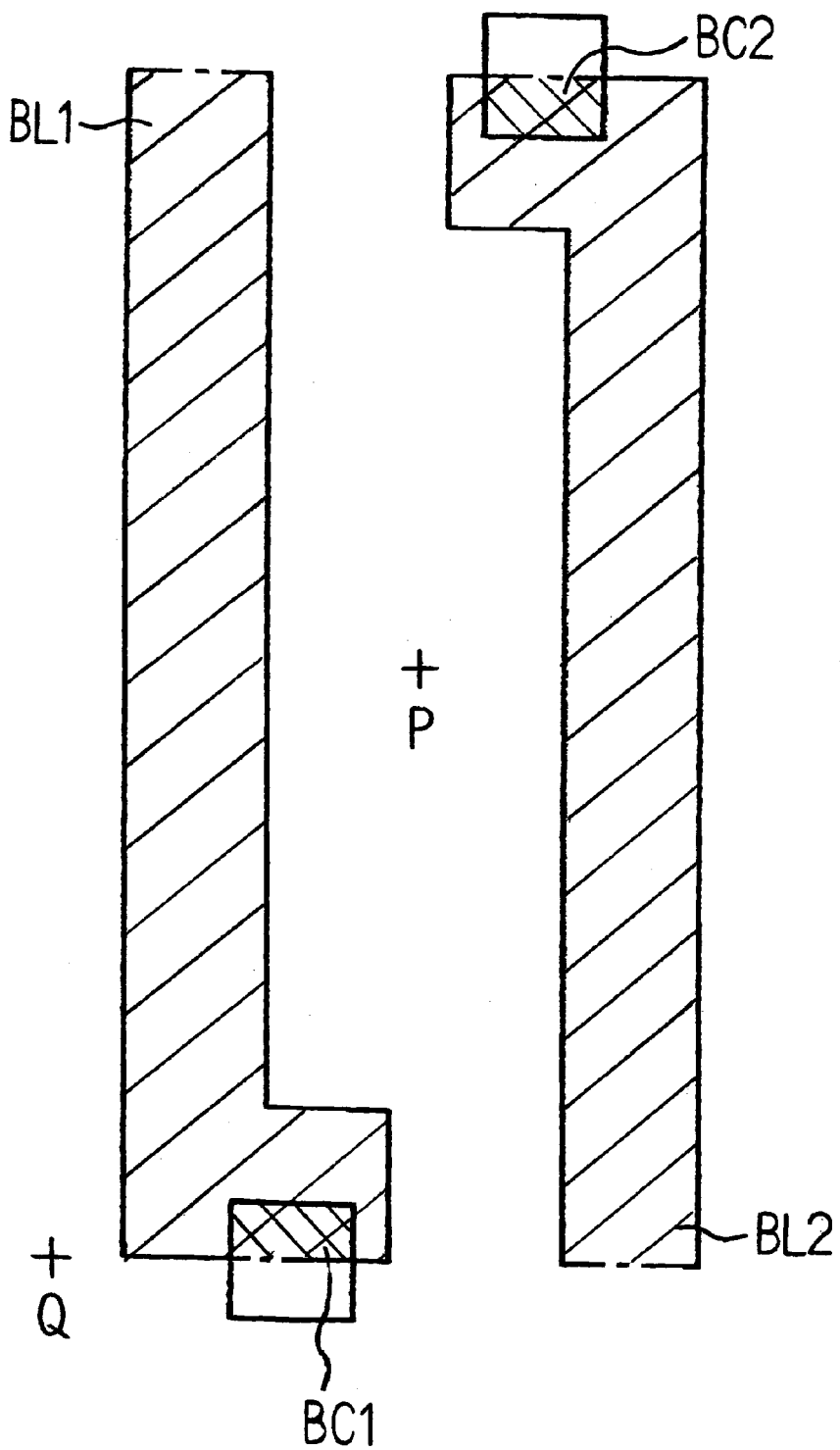
FIG. 7 shows a layout of the memory cell of the semiconductor memory device according to the first embodiment, in which the bit lines and the bit contacts are illustrated.

FIG. 7 shows the layout of the bit lines BL1 and BL2, which are located in a fourth level. The fourth level is arranged over the third level, and is electrically insulated from the third level by an intervening insulating layer (not shown).

The bit lines BL1 and BL2 have patterns that are not overlapped with the ground contacts GC1 and GC2 nor the shared contacts SC1 and SC2. In other words, the patterns of the bit lines BL1 and BL2 are designed in such a way that the edges of the bit lines BL1 and BL2 have sufficient, lateral distances from the ground contacts GC1 and GC2 and the share contacts SC1 and SC2.

The bit lines BL1 and BL2, which extend along the Y-axis, are overlapped with the bit contacts BC1 and BC2, respectively.

Thus, the memory cell 9 of the SRAM according to the first embodiment has the configuration as shown in FIG. 3, which includes the first and second transfer MOSFETs Ta1 and Ta2, the first and second driver MOSFETs Td1 and Td2, and the load resistors R1 and R2.

Figure 8:
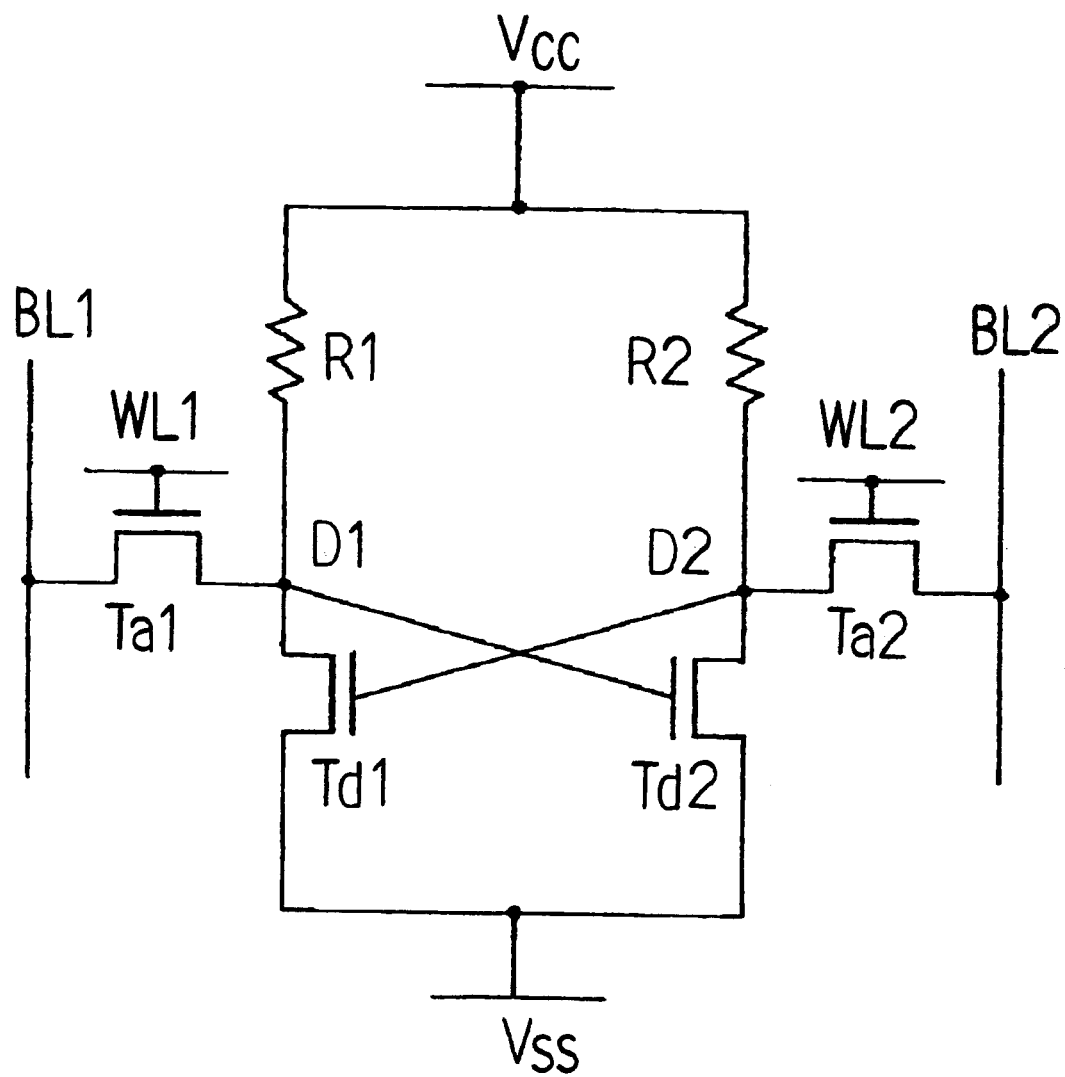
FIG. 8 is a circuit diagram showing the flip-flop circuit realized on the memory cell of the semiconductor memory device according to the invention.

The memory cell 9 has a function of a flip-flop circuit shown in FIG. 8.

In FIG. 8, the two corresponding source/drain regions of the first and second driver MOSFETS Td1 and Td2 are coupled together to be electrically connected to the ground line $V_{ss}$. The remaining two source/drain regions of the first and second driver MOSFETs Td1 and Td2 are electrically connected to the power supply line $V_{cc}$ through the corresponding load resistors R1 and R2.

The connection point of the source/drain region of the first driver transistor Td1 and the load resistor R1 serves as a first storage node formed by the part D1b of the active region D1. The gate of the second driver MOSFET Td2 and the corresponding source/drain region of the first transfer MOSFET Ta1 are electrically connected to the first storage node. The remaining source/drain region of the first transfer MOSFET Ta1 is electrically connected to the bit line BL1. The gate of the first transfer MOSFET Ta1 is electrically connected to the word line WL1.

Similarly, the connection point of the source/drain region of the second driver transistor Td2 and the load resistor R2 serves as a second storage node formed by the part D2b of the active region D2. The gate of the first driver MOSFET Td1 and the corresponding source/drain region of the second transfer MOSFET Ta2 are electrically connected to the second storage node. The remaining source/drain region of the second transfer MOSFET Ta2 is electrically connected to the bit line BL2. The gate of the second transfer MOSFET Ta2 is electrically connected to the word line WL2.

With the SRAM according to the first embodiment, the first and second driver MOSFETs Td1 and Td2 are laid out in such a way that the channel regions of the first and second driver MOSFETs Td1 and Td2 extend in the direction 45° oblique to the word lines WL1 and WL2 or the X-axis. Also, the first and second transfer MOSFETs Ta1 and Ta2 are laid out in such a way that the channel regions of the first and second transfer MOSFETs Ta1 and Ta2 extend in the direction perpendicular to the word lines WL1 and WL2. Therefore, the aspect ratio of the memory cell 9 can be decreased. This means that the long side of the memory cell 9 has a length longer than that of the short side thereof by a small difference.

Accordingly, the pitch of the bit lines BL1 and BL2 can be increased and at the same time, the wiring/interconnection length can be decreased. As a result, the SRAM according to the first embodiment is capable of high-speed operation.

Additionally, the word line WL1 extends along the X-axis, and the channel region of the first transfer MOSFET Ta1 extends along the Y-axis perpendicular to the X-axis. Also, since the size of the word line WL1 along the X-axis is larger than the size of the overlapped area D1a of the active region D1 (i.e., the channel region of the first transfer MOSFET Ta1), the overlapped area D1a has a substantially constant size even if an allowable overlay error occurs between the active region D1 and the word line WL1.

Similarly, the word line WL2 extends along the X-axis, and the channel region of the second transfer MOSFET Ta2 extends along the Y-axis. Also, because of the same reason as that of the overlapped area D1a, the overlapped area D2a of the active region D2 (i.e., the channel region of the second transfer MOSFET Ta2) has a substantially constant size even if an allowable overlay error occurs between the active region D2 and the word line WL2.

Accordingly, the capability of the first and second transfer MOSFETs Ta1 and Ta2 is kept to be the same independent of the allowable overlay error.

Further, the bit contact BC1 is laid out to be overlapped with the source/drain region D1c of the first transfer MOS- FET Ta1, and the overlapped source/drain region D1c extends along the Y-axis. Similarly, the bit contact BC2 is laid out to be overlapped with the source/drain region D2c of the second transfer MOSFET Ta2, and the overlapped source/drain region D2c extends along the Y-axis.

Accordingly, because of the same reason as that of the overlapped area D1a, the contact resistance of the bit contacts BC1 and BC2 is kept to be the same independent of the allowable overlay error.

Thus, the capability of the first and second transfer MOSFETs Ta1 and Ta2 and the contact resistance of the bit contacts BC1 and BC2 are kept to be the same independent of the allowable overlay error. As a result, the performance fluctuation of the memory cells 9 can be prevented, which enables the low-voltage operation and low power-consumption of the SRAM according to the first embodiment.

For example, when the memory cell 9 according to the first embodiment is designed under the design rule of 0.3 μm, it has a width of 1.88 μm, a length of 3.0 μm, and an area of 5.64 μm. On the other hand, the conventional memory cell of FIG. 1 has a width of 1.56 μm, a length of 3.56 μm, and an area of 5.55 μm. Therefore, both of these cells are approximately the same in size.

However, in the memory cell 9 according to the first embodiment, the parasitic capacitance between the bit lines is decreased by 45% of that of the conventional memory cell of FIG. 1 due to the decreased aspect ratio of the cell 9.

Additionally, due to the suppressed performance fluctuation of the memory cells, the lowest operable voltage is decreased by 0.3 to 0.6 V compared with the conventional memory cell of FIG. 1.

SECOND EMBODIMENT

Figure 9:
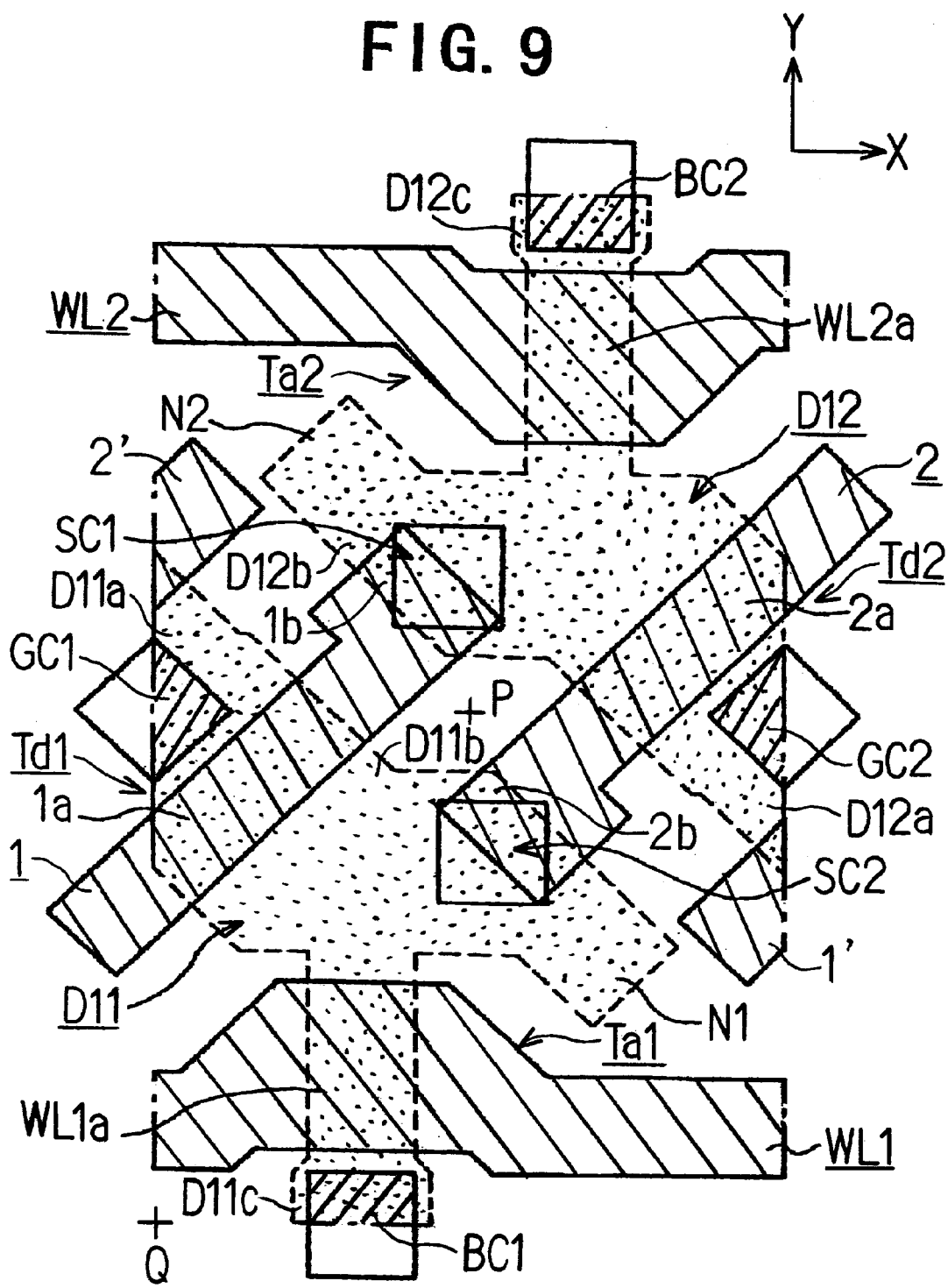
FIG. 9 shows a layout of the memory cell of a semiconductor memory device according to a second embodiment of the invention, in which the word lines, the active regions, the patterned conductive layers, the bit contacts, the ground contacts, and the shared contacts are illustrated.

A semiconductor memory device according to a second embodiment is shown in FIG. 9, the memory cell of which is the same in configuration as that according to the first embodiment except for the two active regions. Therefore, the explanation relating to the same configuration is omitted here by adding the same reference characters to the corresponding elements in FIG. 9 for the sake of simplification of description.

In the second embodiment, two active regions D11 and D12 are formed to be apart from each other in the surface area of the substrate. The active regions D11 and D12 are laid out between the word lines WL1 and WL2 to be symmetric with respect to the central point P.

The active region D11 has the same pattern as that of the active region D1 in the first embodiment except that a protruding portion N1 is additionally formed in the vicinity of the shared contact SC2 to extend in a direction perpendicular to the channel regions of the driver transistors Td1 and Td2.

Similarly, the active region D12 has the same pattern as that of the active region D2 in the first embodiment except that a protruding portion N2 is additionally formed in the vicinity of the shared contact SC1 to extend in the same direction as that of the protruded portion N1.

With the SRAM according to the second embodiment, since the active regions D11 and D12 have the protruding regions N1 and N2 extending in the different direction from that of the channel regions of the first and second transfer MOSFETs Ta1 and Ta2, the capacitance of the storage nodes is increased. This means that the resistance against the "soft errors" to be caused by the α-ray is improved.

Further, because the areas of the active regions D11 and D12 are increased, the shared contacts SC1 and SC2 can be readily overlapped with the active regions D11 and D12, respectively. This improves the reliability of the shared contacts SC1 and SC2.

It is needless to say that the SRAM according to the second embodiment has the same advantages as those in the first embodiment.

THIRD EMBODIMENT

Figure 10:
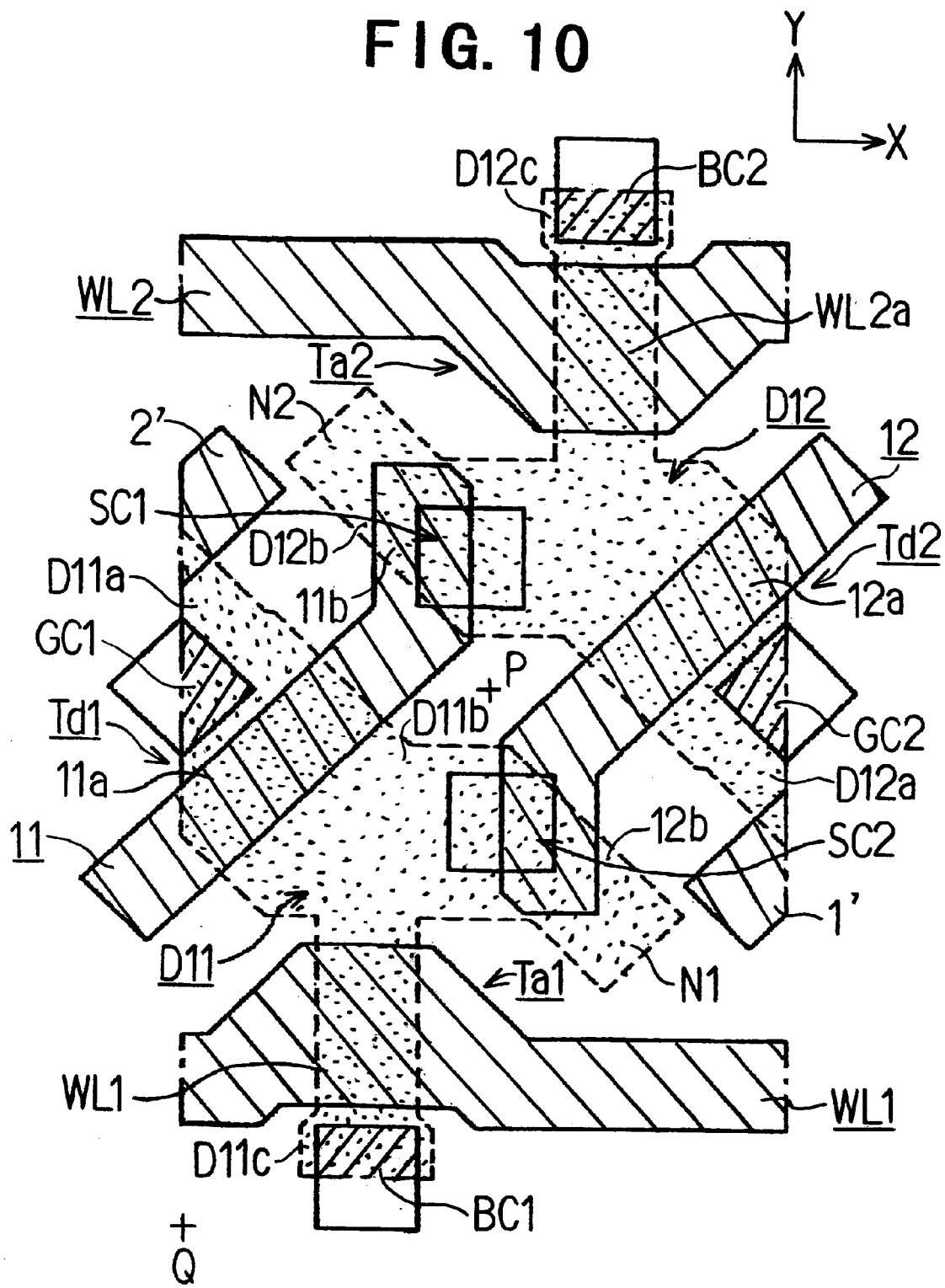
FIG. 10 shows a layout of the memory cell of a semiconductor memory device according to a third embodiment of the invention, in which the word lines, the active regions, the patterned conductive layers, the bit contacts, the ground contacts, and the shared contacts are illustrated.

A semiconductor memory device according to a third embodiment is shown in FIG. 10, which is the same in configuration as that according to the second embodiment except for the two conductive layers. Therefore, the explanation relating to the same configuration is omitted here by adding the same reference characters to the corresponding elements in FIG. 10 for the sake of simplification of description.

As seen from FIG. 10, two patterned conductive layers 11 and 12 are formed between the word lines WL1 and WL2 to extend in the direction oblique to the X-axis by 45°. The conductive layers 11 and 12 are laid out to be symmetric with respect to the central point P.

The conductive layer 11 has a plan shape including an elongated part running obliquely to the X-axis and an additional elongated part running along the Y-axis. The additional elongated part is overlapped with the protruding portion N1 of the active region D12.

Similarly, the conductive layer 12 has a plan shape including an elongated part running obliquely to the X-axis and an additional elongated part running along the Y-axis. The additional elongated part is overlapped with the protruding portion N2 of the active region D11.

With the SRAM according to the third embodiment, because the areas of the active regions D11 and D12 and the conductive layers 11 and 12 are increased, there is an additional advantage that the reliability of the shared contacts SC1 and SC2 is further improved compared with the second embodiment.

FOURTH EMBODIMENT

Figure 11:
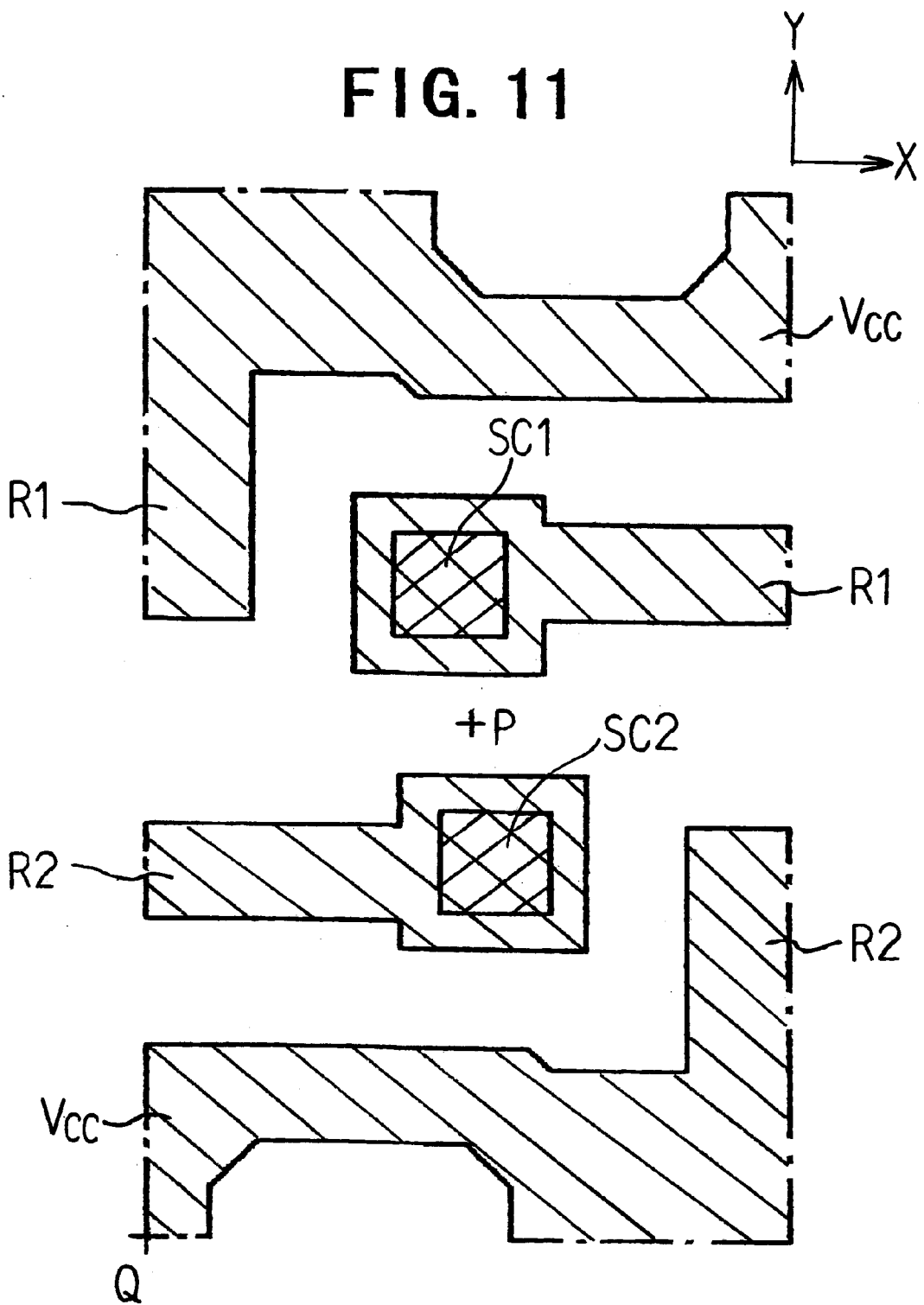
FIG. 11 shows a layout of the memory cell of a semiconductor memory device according to a fourth embodiment of the invention, in which the power supply line, the shared contacts, and the resistors are illustrated.

A semiconductor memory device according to a fourth embodiment is shown in FIG. 11, the memory cell of which is the same in configuration as that according to the first embodiment except for the load resistors.

In the fourth embodiment, as shown in FIG. 11, the power supply lines $V_{cc}$ are formed to extend along the X-axis (i.e., the word lines WL1 and WL2). Also, the load resistor R1 is divided into two parts, one of which extends along the X-axis and the other thereof extends along the Y-axis. Similarly, the load resistor R2 is divided into two parts, one of which extends along the X-axis and the other thereof extends along the Y-axis.

With the SRAM according to the fourth embodiment, since the parts of the load resistors R1 and R2 are formed to extend along the power supply lines $V_{cc}$, the total area of the resistors R1 and R2 can be reduced while keeping the length of the resistors R1 and P2 almost unchanged. This means that the resistors R1 and R2 are readily formed.

When the power supply line $V_{cc}$ and the load resistors R1 and R2 are located in the second level and the ground line $V_{ss}$ is located in the third level or higher, there is an additional advantage that a sufficient distance can be obtained between the ground contacts GC1 and GC2 and the resistors R1 and R2.

Since the overlapped area of the resistors R1 and R2 with the bit lines BL1 and BL2 is decreased, there is another additional advantage that the parasitic capacitance between the bit lines can be reduced. For example, in the fourth embodiment, the parasitic capacitance between the bit lines is decreased by approximately 30% compared with the first embodiment.

FIFTH EMBODIMENT

Figure 12:
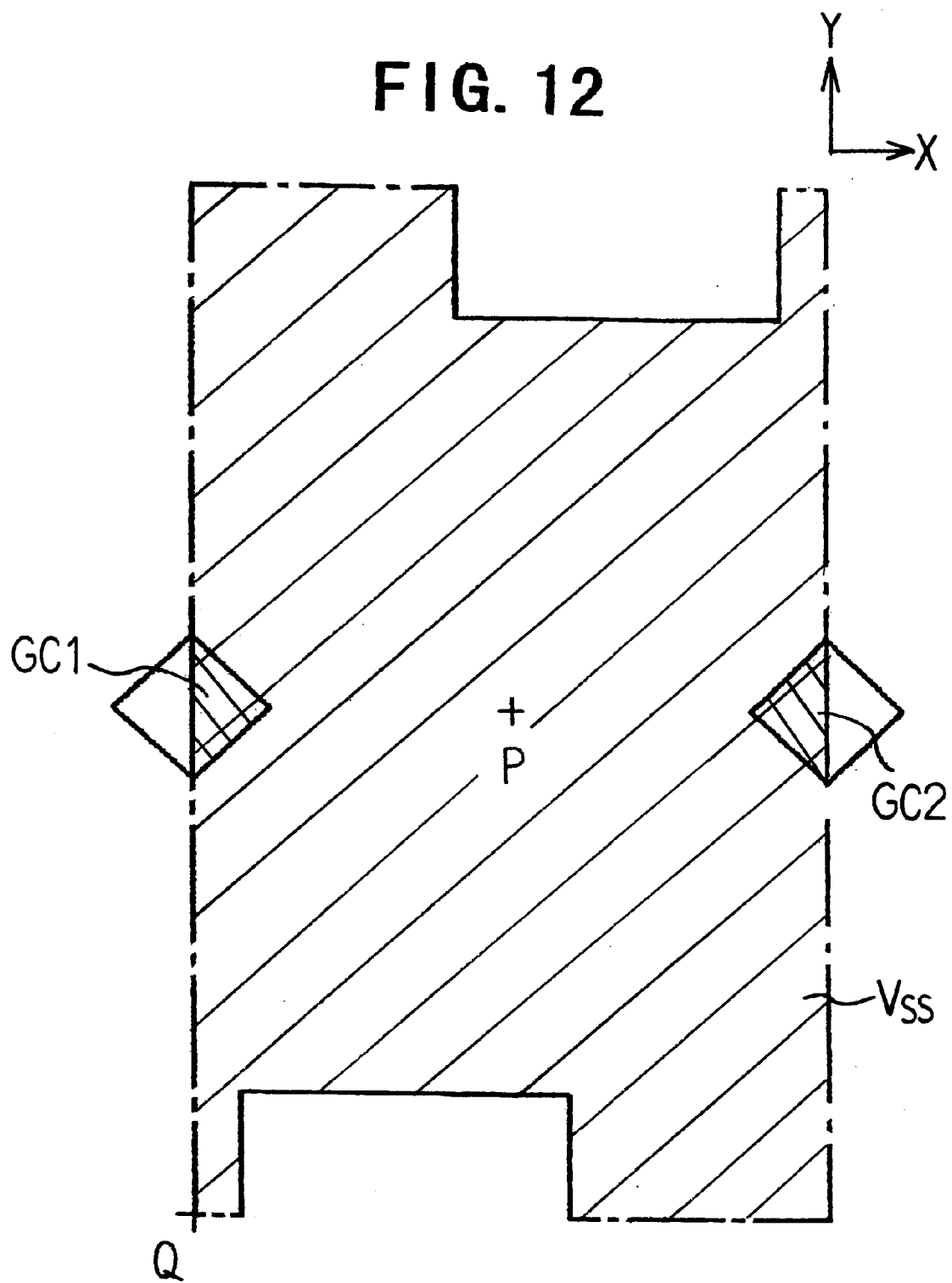
FIG. 12 shows a layout of the memory cell of a semiconductor memory device according to a fifth embodiment of the invention, in which the ground line and the ground contacts are illustrated.

A semiconductor memory device according to a fifth embodiment is shown in FIG. 12, where the pattern of the ground line $V_{ss}$ is illustrated.

In this fifth embodiment, the patterned conductive layers 1 and 2 and the word lines WL1 and WL2 are located in the first level, the power supply lines $S_{cc}$ and the load resistors R1 and R2 are located in the second level, and the ground line $V_{ss}$ is located in the third level.

The active regions D1 and D2, the patterned conductive layers 1 and 2, the ground contacts GC1 and GC2, the shared contacts SC1 and SC2, and the bit contacts BC1 and BC2 are the same as those in the first embodiment, which are shown in FIG. 4. The layouts of the bit lines BL1 and BL2 are the same as those in the first embodiment, which are shown in FIG. 7. The layouts of the power supply lines $S_{cc}$ and the load resistors R1 and R2 are the same as those in the fourth embodiment, which are shown in FIG. 11.

With the SRAM according to the fifth embodiment, since the patterned conductive layers 1 and 2 and the word lines WL1 and WL2 are located in the first level, the power supply lines $S_{cc}$ and the load resistors R1 and R2 are located in the second level, and the ground line $V_{ss}$ is located in the third level, there is an additional advantage that the area of the ground line $V_{ss}$ can be increased, thereby decreasing the resistance of the ground line $V_{ss}$.

Because of the increased flexibility in designing the layout of the ground line $V_{ss}$, there is another additional advantage that the pattern of the ground line $V_{ss}$ can be fabricated easier.

SIXTH EMBODIMENT

A semiconductor memory device according to a sixth embodiment is shown in FIG. 13, where the patterns of the ground line $V_{ss}$ and the bit contacts are illustrated.

In this sixth embodiment, the power supply line $V_{cc}$ and the load resistors R1 an d R2 are located in the second level and the ground line $V_{ss}$ is located in the third level or higher, which is the same as that of the fourth embodiment. The ground line $V_{ss}$ is laid out to be sufficiently apart from the bit contacts BC1 and BC2 in order not to be overlapped with the bit contacts BC1 and BC2.

Additional bit contacts BC3 and BC4 are arranged to be located near the bit contacts BC1 and BC2, respectively, as shown in FIG. 13. The additional bit contacts BC3 and BC4 are formed in the same patterning process as that of the ground contacts GC1 and GC2.

Connection pads P1 and P2 are arranged to be overlapped with the bit contacts BC1 and BC3 and the bit contacts BC2 and BC4, respectively, as shown in FIG. 13. The pads P1 and P2 are formed in the same patterning process as that of the ground line $V_{ss}$.

The active regions D1 and D2, the patterned conductive layers 1 and 2, the ground contacts GC1 and GC2, the shared contacts SC1 and SC2, and the bit contacts BC1 and BC2 are the same as those in the first embodiment, which are shown in FIG. 4. The layouts of the bit lines BL1 and BL2 are the same as those in the first embodiment, which are shown in FIG. 7. The layouts of the power supply lines $S_{cc}$ and the load resistors R1 and R2 are the same as those in the fourth embodiment, which are shown in FIG. 11.

With the SRAM according to the sixth embodiment, the connection pads P1 and P2 are prepared for the bit contacts BC1 and BC3 and the bit contacts BC2 and BC4, respectively. Therefore, there is an additional advantage of improved reliability of the bit contacts.

SEVENTH EMBODIMENT

Figure 14:
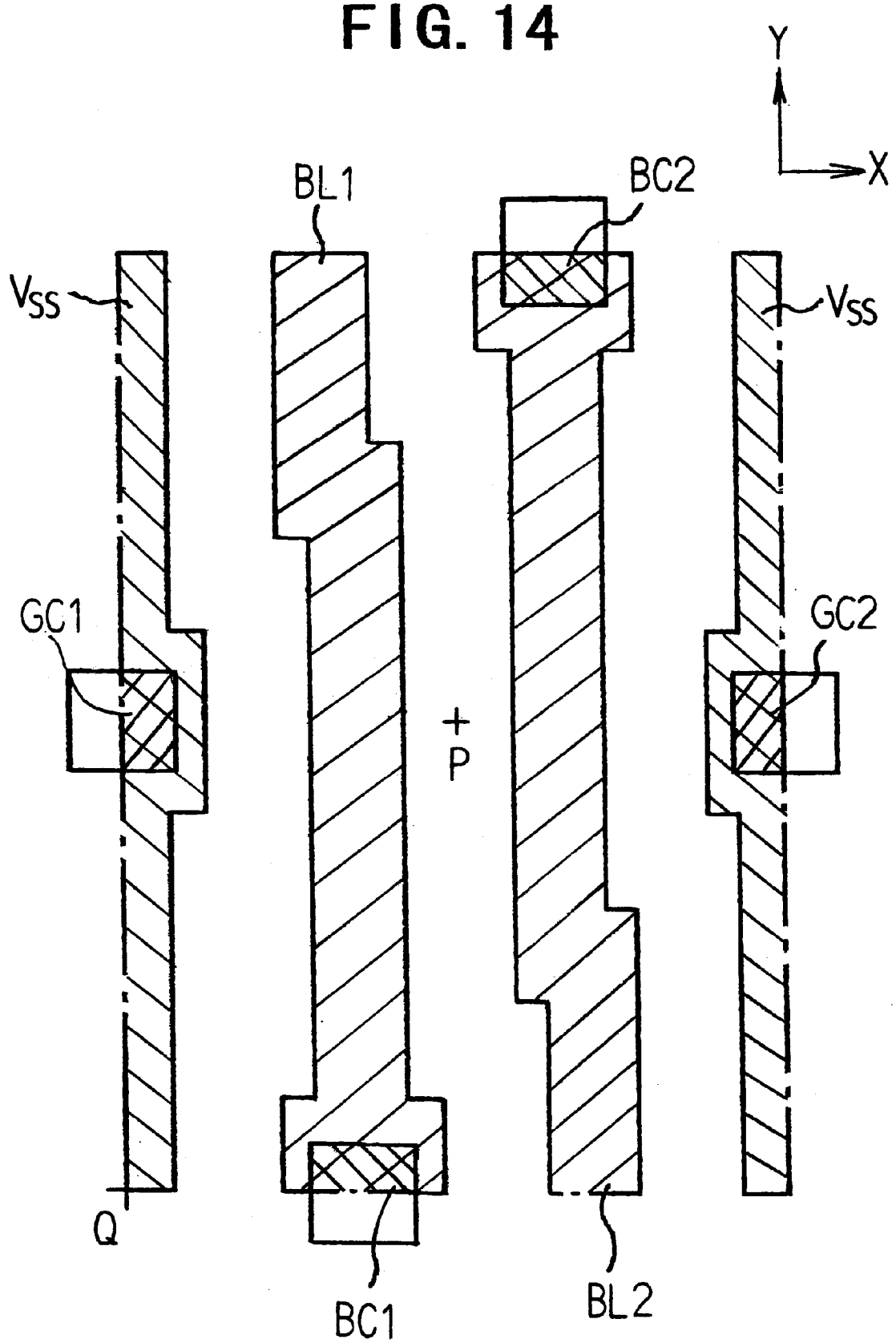
FIG. 14 shows a layout of the memory cell of a semiconductor memory device according to a seventh embodiment of the invention, in which the ground line, the ground contacts, the bit lines, and the bit contact are illustrated.

A semiconductor memory device according to a seventh embodiment is shown in FIG. 14, where the patterns of the bit lines BL1 and BL2, the bit contacts, BC1 and BC2, the ground lines Vs$_5$, and the ground contacts GC1 and GC2 are illustrated.

In this seventh embodiment, unlike the above first to sixth embodiments, the ground contacts GC1 and GC2 and the bit contacts BC3 and BC4 are formed in the same patterning process, and the ground lines $V_{ss}$ and the bit lines BL1 and BL2 are formed in the same patterning process.

The bit lines BL1 and BL2 extend along the Y-axis. Each of the ground lines $V_{ss}$ has a linear pattern and extends along the Y-axis. The ground lines $V_{ss}$ are overlapped with the ground contacts GC1 and GC2, respectively.

The active regions D1 and D2, the patterned conductive layers 1 and 2, the ground contacts GC1 and GC2, the shared contacts SC1 and SC2, and the bit contacts BC1 and BC2 are the same as those in the first embodiment, which are shown in FIG. 4. The layouts of the power supply lines $S_{cc}$ and the load resistors R1 and R2 are the same as those in the fourth embodiment, which are shown in FIG. 11.

With the SPM according to the seventh embodiment, the ground contacts GC1 and GC2 and the bit contacts BC1 and BC2 are formed in the same patterning process, and the ground lines $V_{ss}$ and the bit lines BL1 and BL2 are formed in the same patterning process. Therefore, the number of the necessary masks can be decreased by two while keeping the size of the memory cell 9 approximately constant. This results in an additional advantage of improvement in fabrication yield and fabrication cost.

Also, since the ground lines $V_{ss}$ and the bit Lines BL1 and BL2 may be made of a proper metal material, there is an additional advantage that the resistance of the ground lines $V_{ss}$ can be largely decreased compared with the case where the ground lines $V_{ss}$ are made of a silicide or polycide material. This leads to the stable operation of the SRAM.

In the above first to seventh embodiments, the channel regions of the first and second driver MOSFETs Td1 and Td2 extend along the direction oblique to the X and Y axes by 45°. However, it is needless to say that the inclination angle of these channel regions may be changed to any value as necessary.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor memory device having memory cells regularly arranged on a semiconductor substrate;

each of said memory cells comprising:
- (a) a first active region formed in a surface area of said substrate;
- (b) a second active region formed in the surface area of said substrate to be apart from said first active region;
- (c) a first word line formed in a first level to extend in a first direction;
    said first word line being overlapped with said first active region, thereby forming a first overlapped area of said first active region and an overlapped area of said first word line;
    a channel region of a first transfer transistor being formed in said first overlapped area of said first active region to extend in a second direction perpendicular to said first direction;
    a pair of source/drain regions of said first transfer transistor being formed in said first active region at each side of said first overlapped area of said first active region;
    said overlapped area of said first word line serving as a gate electrode of said first transfer transistor;
- (d) a second word line formed in said first level to extend in said first direction;
    said second word line being overlapped with said second active region, thereby forming a first overlapped area of said second active region and an overlapped area of said second word line;
    a channel region of a second transfer transistor being formed in said first overlapped area of said second active region to extend in said second direction;
    a pair of source/drain regions of said second transfer transistor being formed in said second active region at each side of said first overlapped area of said second active region;
    said overlapped area of said second word line serving as a gate electrode of said second transfer transistor;
- (e) a first patterned conductive layer formed in said first level to be overlapped with said first active region, thereby forming a second overlapped area of said first active region and an overlapped area of said first conductive layer;
    a channel region of a first driver transistor being formed in said second overlapped area of said first active region to extend in a third direction oblique to said first direction;
 a pair of source/drain regions of said first driver transistor being formed in said first active region at each side of said second overlapped area of said first active region;
    said overlapped area of said first conductive layer serving as a gate electrode of said first driver transistor;
- (f) a second patterned conductive layer formed in said first level to be overlapped with said second active region, thereby forming a second overlapped area of said second active region and an overlapped area of said second conductive layer;
    a channel region of a second driver transistor being formed in said second overlapped area of said second active region to extend in said third direction;
    a pair of source/drain regions of said he second driver transistor being formed in said second active region at each side of said second overlapped area of said second active region;
    said overlapped area of said second conductive layer serving as a gate electrode of said second driver transistor;
- (g) a first bit line formed in a second level to extend in said second direction; and
- (h) a second bit line formed in said second level to extend in said third direction.

2. The device as claimed in claim 1, further comprising:
- (i) a first bit contact laid out to be overlapped with one of said pair of source/drain regions of said first transfer transistor;
    said overlapped one of said pair of source/drain regions of said first transfer transistor with said first bit contact extending in said second direction; and
- (j) a second bit contact laid out to be overlapped with one of said pair of source/drain regions of said second transfer transistor;
    said overlapped one of said pair of source/drain regions of said second transfer transistor with said second bit contact extending in said second direction;
    wherein said first overlapped area of said first active region is designed to have a substantially constant size independent of an allowable overlay error between said first active region and said first word line;
    and wherein said first overlapped area of said second active region is designed to have a substantially constant size independent of an allowable overlay error between said second active region and said second word line.

3. The device as claimed in claim 2, wherein each of said memory cells has a central point;
and wherein said first and second active regions are formed symmetrically with respect to said central point;
and wherein said first and second word lines are formed symmetrically with respect to said central point;
and wherein said first and second patterned conductive layers are formed symmetrically with respect to said central point;
and wherein said first and second bit contacts are formed symmetrically with respect to said central point.

4. The device as claimed in claim 1, wherein said first conductive layer is overlapped with said second active region;
and wherein said first conductive layer is electrically connected to said second active region through a first shared contact;
and wherein said second conductive layer is overlapped with said first active region;
and wherein said second conductive layer is electrically connected to said first active region through a second shared contact.

5. The device as claimed in claim 1, wherein said first active region includes a first protruding region in the vicinity of said first shared contact;
and wherein said first protruding region protrudes in a direction different from the direction of said channel of said first transfer transistor;
and wherein said second active region includes a second protruding region in the vicinity of said second shared contact;
and wherein said second protruding region protrudes in a direction different from the direction of said channel of said second transfer transistor.

6. The device as claimed in claim 1, wherein said first conductive layer has a part extending perpendicular to said first direction in the vicinity of said first shared contact;

and wherein said part of said first conductive layer is overlapped with said second active region;

and wherein said second conductive layer has a part extending perpendicular to said first direction in the vicinity of said second shared contact;

and wherein said part of said second conductive layer is overlapped with said first active region.

7. The device as claimed in claim. 1, wherein each of said memory cells has a first load element for said first driver transistors and a second load element for said second driver transistor;

and wherein said first and second load elements extend in said first direction, respectively.

8. The device as claimed in claim 7, further comprising:

a third bit contact electrically connected to said first bit contact; and a fourth bit contact electrically connected to said second bit contact.

9. The device as claimed in claim 1, further comprising:

first and second ground contacts located in a same level as that of said first and second bit contacts; and a ground lined located in a same level as that of said first and second bit lines.

* * * * *